(12) United States Patent
Liu et al.

(10) Patent No.: US 8,467,257 B1
(45) Date of Patent: Jun. 18, 2013

(54) CIRCUIT AND METHOD FOR GENERATING A SENSE AMPLIFIER ENABLE SIGNAL BASED ON A VOLTAGE LEVEL OF A TRACKING BITLINE

(75) Inventors: Jack Liu, Taipei (TW); Yi-Wei Lin, New Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/332,045

(22) Filed: Dec. 20, 2011

(51) Int. Cl.
*G11C 7/08* (2006.01)

(52) U.S. Cl.
USPC ........... 365/196; 365/194; 365/203; 365/204; 365/156; 365/154

(58) Field of Classification Search
USPC .............. 365/196, 194, 195, 191, 203, 204, 365/156, 154
See application file for complete search history.

(56) References Cited

U.S. PATENT DOCUMENTS

| 5,485,430 A * | 1/1996 | McClure | 365/189.05 |
| 7,719,868 B2 * | 5/2010 | Vollrath | 365/63 |
| 8,027,193 B2 * | 9/2011 | Lee | 365/185.02 |

* cited by examiner

*Primary Examiner* — Andrew Q Tran
(74) *Attorney, Agent, or Firm* — Lowe Hauptman Ham & Berner, LLP

(57) ABSTRACT

A circuit is usable to generate a sense amplifier enable (SAE) signal for a static random access memory (SRAM) circuit. The circuit includes a first tracking bit line, a second tracking bit line, a tracking cell, and a control logic circuit. The second tracking bit line is electrically connected to the first tracking bit line. The tracking cell has a driving terminal and a non-driving terminal, where the non-driving terminal is connected to the second tracking bit line, and the driving terminal is connected to the first tracking bit line and configured to selectively charge or discharge a voltage on the first tracking bit line in response to a control signal. The control logic circuit is coupled to the first tracking bit line and configured to generate the SAE signal in response to the voltage level on the first tracking bit line.

20 Claims, 6 Drawing Sheets

CIRCUIT AND METHOD FOR GENERATING A SENSE AMPLIFIER ENABLE SIGNAL BASED ON A VOLTAGE LEVEL OF A TRACKING BITLINE

BACKGROUND

For an increasing range of applications, low power dissipation is an integrated circuit (IC) feature that is as important as area and speed. For portable systems, low power circuits allow longer periods of operation. For ICs embedded in high performance systems, low power reduces the expense for chip cooling or increases reliability due to the low chip temperature. One disadvantage associated with a reduced supply voltage is that transistors can become more sensitive to gate delays due to perimeter variations. Furthermore, smaller geometry transistors with a smaller feature size increase the effects of geometry dependent perimeter variations. These variations act globally on the entire chip so that each device on a chip can show the same order of deviations. Worst case parameters are often chosen during design to counter the effects of global intra die variations.

The yield of low voltage digital circuits is sensitive to local gate delay variations due to uncorrelated intra-die parameter deviations. Such deviations can be caused by statistical deviations of the doping concentration that lead to more pronounced delay variations for minimum transistor sizes. The path delay variations increase for smaller device dimensions and reduced supply voltages. Circuits with a number of critical paths having a low logic depth are particularly sensitive to uncorrelated gate delay variations. Scenarios for future technologies show the increased impact of uncorrelated delay variations on digital design.

BRIEF DESCRIPTION OF DRAWINGS

One or more embodiments are illustrated by way of example, and not by limitation, in the FIGs. of the accompanying drawings, wherein elements having the same reference numeral designations represent like elements throughout. It is emphasized that in accordance with the standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting. For example, the formation of a first feature over or on a second feature in the description that follows includes embodiments in which the first and second features are formed in direct contact, and also includes embodiments in which additional features are formed between the first and second features.

Static random-access memory (SRAM) is a type of semiconductor memory that uses bistable latching circuitry to store each bit. SRAM is usable to retain data, but remains volatile in the conventional sense that data is eventually lost when the memory is not powered.

Figure 1:
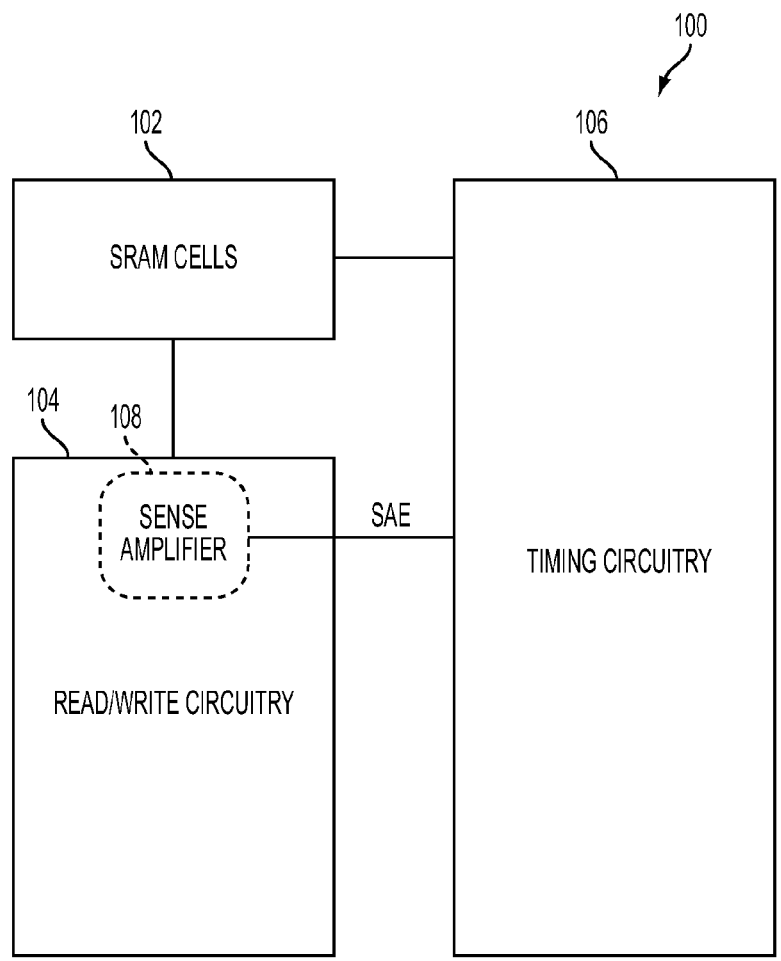
FIG. 1 is a block diagram of a static random-access memory (SRAM) circuit in accordance with an embodiment.

FIG. 1 is a block diagram of a SRAM circuit 100 in accordance with an embodiment. SRAM circuit 100 includes an array of SRAM cells 102, read/write circuitry 104, and timing circuitry 106. SRAM cells 102 are coupled to read/write circuitry 104 and timing circuitry 106. Read/write circuitry 104 is also coupled to timing circuitry 106.

The array of SRAM cells 102 stores data accessible by read/write circuitry 104. The read/write circuitry 104 comprises a sense amplifier 108. The sense amplifier 108 reads data from the array of SRAM cells 102 upon receipt of a sense amplify enable (SAE) signal. The SAE signal has a timing generated by the timing circuitry 106 based on a tracking capacitance.

Figure 2:
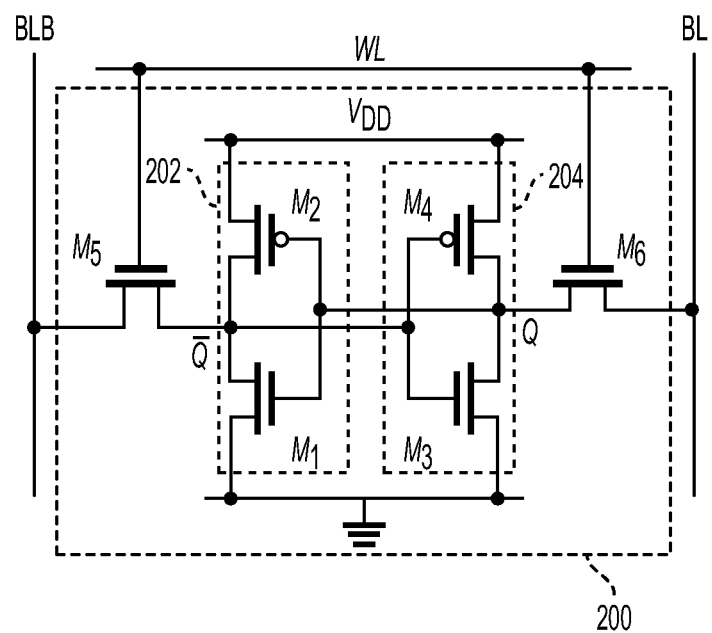
FIG. 2 is a schematic diagram of a storage cell of an SRAM circuit in accordance with an embodiment.

FIG. 2 is a schematic diagram of a SRAM storage cell circuit 200 (also referred to as "SRAM storage cell" in this application) in accordance with an embodiment. The SRAM storage cell 200 is usable in the array of SRAM cells 102 depicted in FIG. 1. The SRAM storage cell 200 is coupled to a word line WL and bit lines BL and BLB of a SRAM circuit. SRAM storage cell 200 includes transistors M1, M2, M3, M4, M5, and M6. Transistors M1 and M2 are coupled with each other and between VDD and ground to form an inverter 202 and transistors M3 and M4 are similarly coupled to form an inverter 204. Inverters 202 and 204 are cross-coupled to each other. Transistor M5 is coupled between the output of the inverter 202 and the bit line BLB, and transistor M6 is coupled between the output of the inverter 204 and the bit line BL. The word line WL is coupled to the gates of the transistors M5 and M6 in order to selectively couple the outputs of the inverters 202 and 204 with a corresponding bit line BL or BLB during read and write operations.

Word line WL transfers a word line enable signal, indicating the beginning of a memory read cycle, which is concurrently received by the storage cell 100 to be read. The word line enable signal is a signal that activates transistors M5 and M6. When active, transistors M5 and M6 couple the output of inverters 202 and 204 to bit lines BL and BLB. Bit lines BL and BLB are used to transfer data for both read and write operations. During a read operation, inverters 202 and 204 drive the voltage levels at the corresponding bit lines BL and BLB high and low in the SRAM cell 200.

Each bit in SRAM 100 is stored in a storage cell similar to the SRAM storage cell 200 depicted in FIG. 2. The cross-coupled inverters 202 and 204 in the SRAM storage cell 200 provide two stable voltage states which are used to denote logic values 0 and 1. The SRAM 200 shown in FIG. 2 uses six Metal-Oxide Semiconductor Field Effect Transistors (MOSFETs) to store datum of each memory bit. In some embodiments, other kinds of SRAM chips use 8 transistors, 10 transistors or more transistors per storage cell unit. Generally, the fewer transistors needed per storage cell, the smaller area occupied by each cell. Since the cost of processing a semiconductor wafer is relatively fixed, using smaller cells and packing more bits on one wafer reduces the cost per bit of a memory circuit.

Figure 3:
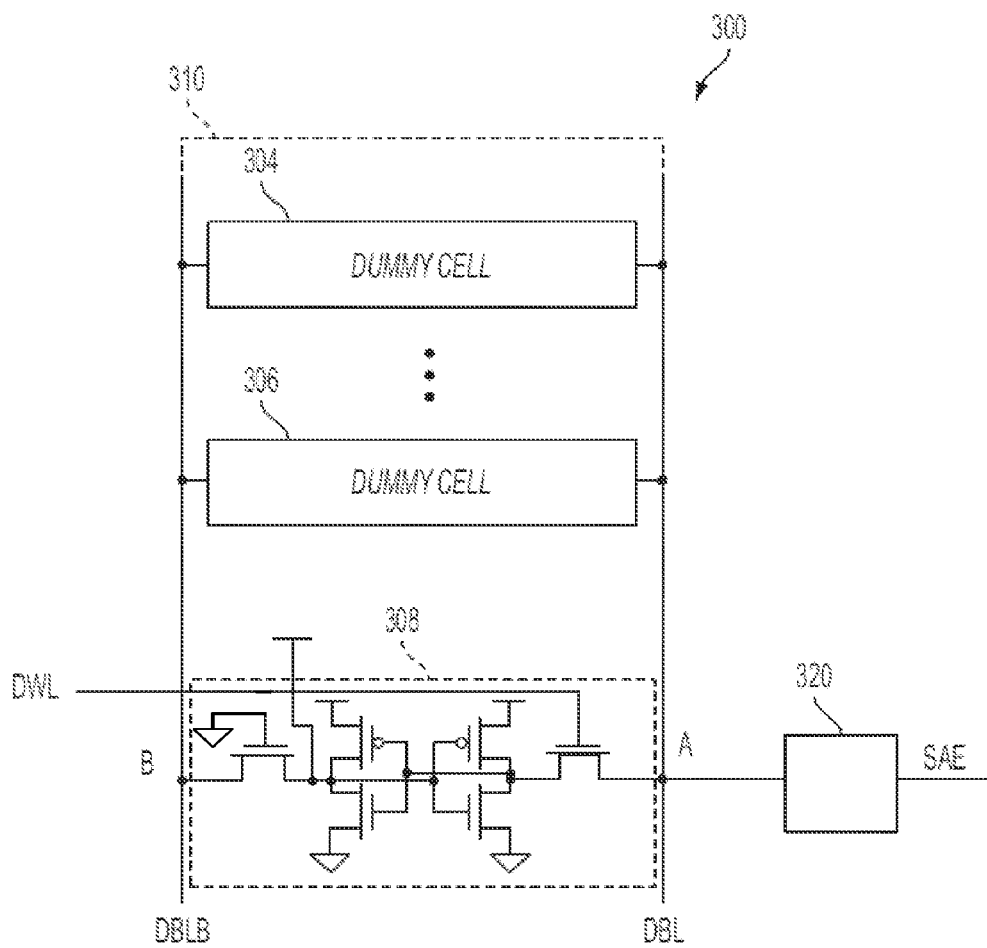
FIG. 3 is a schematic diagram of a circuit to generate a timing signal for an SRAM circuit in accordance with an embodiment.

FIG. 3 is a schematic diagram of a circuit 300 to generate a timing signal for an SRAM circuit in accordance with an embodiment. Circuit 300 includes a first tracking bit line DBL and a second tracking bit line DBLB, a number of dummy SRAMs cells 304 and 306, a tracking cell 308, a dummy word line DWL, and logic control circuitry 320 coupled to the first tracking bit line DBL. Tracking bit lines DBL and DBLB are coupled to dummy SRAMs cells 304 and 306, and also the tracking cell 308. Dummy cells 304 and 306, and tracking cell 308 have substantially the same configuration as the SRAM storage cell described with reference to FIG. 2. In some embodiments, cells 304, 306, and 308 vary from FIG. 2 but retain the same functionality. Tracking bit line DBL has a tracking capacitance $C_{BL}$, and tracking bit line DBLB has a tracking capacitance $C_{BLB}$. In some embodiments, the dummy cells 304 and 306 are omitted.

Tracking cell 308 receives a control signal on the dummy word line DWL and generates a tracking signal on the tracking bit line DBL by charging or discharging a voltage on the first tracking bit line DBL, where the tracking signal has a read timing τ after the receipt of the control signal. During a read operation, the SAE signal is activated to trigger the sense amplifier 108 after the difference of the voltage levels of the bit lines BL and BLB coupled to the currently-accessed storage cell is sufficient to be distinguished by the sense amplifier 108. Therefore, the circuit 300 is configured to delay the timing of the control signal at dummy word line DWL by charging or discharging at least the first tracking bit line DBL. In some embodiments, at least one of the dummy cell 304 or 306 is used to charge or discharge the first tracking bit line DBL together with the tracking cell 308.

Logic control circuitry 320 is connected to the first tracking bit line and usable to convert the voltage change on the first tracking bit line DBL into the SAE signal. In some embodiments, the tracking signal on the first tracking bit line DBL is converted to the SAE signal for controlling the sense amplifier 108 without additional delay. In some embodiments, the control logic circuitry 320 has a built-in logic delay circuit and generates a sense amplify enable (SAE) signal according to the tracking signal on the tracking bit line DBL plus a delay generated by the built-in logic delay circuit.

In some embodiments, the value of capacitance $C_{BL}$ is sufficient to provide a timing signal that accounts for weak bit timing and avoids or minimizes the need for logic delay. A weak bit is a memory cell that, compared with other storage cells, has a relatively low current driving capability due to process/device variations. Weak bit timing refers to the delay time needed to guarantee a proper read operation of the weak bit cell. Read timing period τ is a function of the tracking capacitance $C_{BL}$ where the tracking capacitance of the circuit has a capacitance sufficient to overcome a timing of a weak bit cell of the SRAM circuit. Embodiments utilize capacitance $C_{BL}$ of the bit line BL to account for and cover for any timing requirements due to weak bits. Therefore, the read timing period τ allows a proper read operation of a memory cell, having a driving current within a predetermined range, of the SRAM circuit. For example, the relationship between the read timing delay τ, the driving current of the tracking cell $I_{CELL}$, the capacitance C driven by the tracking cell 308, and the voltage V to be discharged by the tracking cell 308 has the relationship:

$$\tau = \frac{CV}{I_{CELL}}$$

If the driving current of the tracking cell $I_{CELL}$ is n times that of a weak bit cell, the capacitance C is increased to provide sufficient read timing delay τ.

The capacitance C driven by the tracking cell 308 is set to meet the timing requirements associated with the weak bit cell and avoid or reduce the need for the imposition of a logic delay circuit to account for all possible process variations. As depicted in FIG. 3, the first tracking bit line is connected to a driving terminal A of the tracking cell 308, and second tracking bit line DBLB is connected to a non-driving terminal B of the tracking cell 308. In some embodiments, the second tracking bit line DBLB is pulled to a logic high voltage and not actually used for signaling purposes, the tracking bit line BLB is usable to increase the effective capacitance driven by the tracking circuit 308.

In some embodiments, the tracking bit lines DBL and DBLB are optionally connected by another conductive line 310, and the capacitance C driven by the tracking cell 308 includes at least the capacitance $C_{BL}$ and the capacitance $C_{BLB}$. In some embodiments, at least one of the tracking bit lines DBL and DBLB is divided into two or more isolated segments, and thus the tracking bit lines DBL and DBLB are configured to provide a predetermined capacitance no greater than the combination of the capacitance $C_{BL}$ and the capacitance $C_{BLB}$. In at least one embodiment, the capacitance C equals ($C_{BL}+C_{BLB}$). In yet another embodiment, only the tracking bit line DBL and half of the tracking bit line DBLB are used, and the capacitance C equals ($C_{BL}+0.5*C_{BLB}$). In some embodiments, the timing delay provided by arranging the tracking bit lines DBL and DBLB is sufficient to meet the timing requirements for possible weak bit cells, and the logic delay circuit may be significantly simplified or even omitted in some embodiments.

Figure 4:
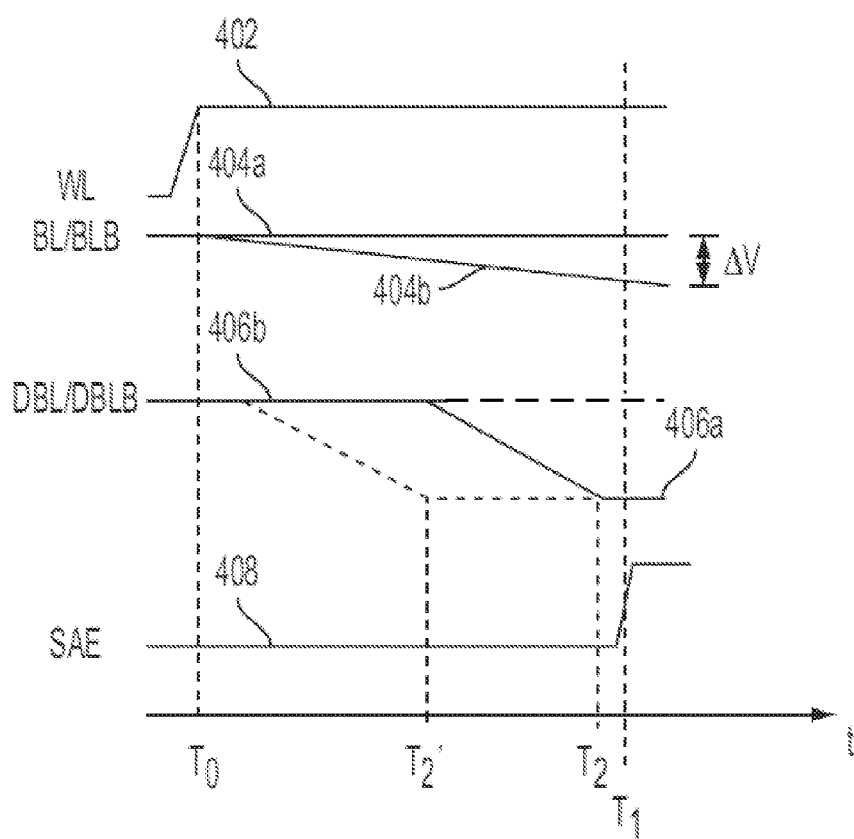
FIG. 4 is a chart of timing signals for accessing memory cells in accordance with an embodiment.

FIG. 4 is a chart of timing signals for accessing memory cells in accordance with an embodiment. The timing chart depicts curves of a word line signal 402, a bit line BL signal 404a, a bit line BLB signal 404b, a tracking bit line DBL signal 406a, a tracking bit line DBLB signal 406b, and the sense amplify enable (SAE) signal 408. As depicted in FIG. 4, after the word line signal transmitted from low to high at time T0, the SRAM storage cell being accessed starts to discharge one of the corresponding bit lines BL or BLB toward low, such as the bit line BLB as represented by curve 404b in FIG. 4. At the same time, the tracking circuit 200 receives a dummy work line signal substantially the same as the word line signal 402 and starts to discharge one of the tracking bit lines DBL or DBLB, such as the bit line DBL as represented by curve 406a. The SAE signal as represented by curve 408 is generated according to the DBL signal 406a. The SAE signal goes from low to high at time T1 when the voltage difference between the bit lines BL and BLB of the currently accessed storage cell is greater than a threshold at which the sensing amplifier is capable of further distinguishing the read datum.

The capacitance C driven by the tracking cell 308 is configured to be sufficient to provide a timing delay that accounts for the read timing for a weak bit cell. In other words, the capacitance C coupled to the tracking cell 308 is configured to allow the tracking bit line DBL to be discharged to low at a time as close to time T1 as possible, such as time T2 rather than time T2'. If the Time T2 and T1 are close enough to each other, in some embodiments, the logic delay circuit between the tracking bit line DBLB and the SAE signal is significantly simplified or even omitted.

Figure 5:
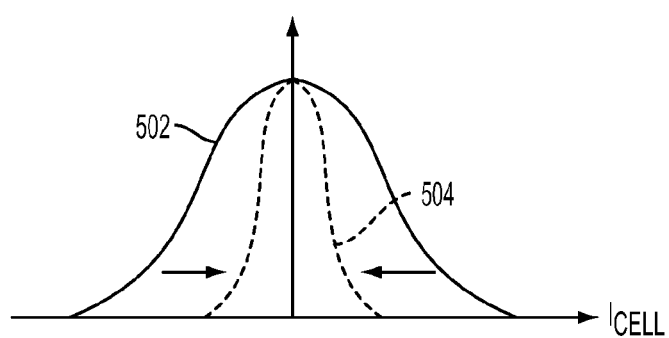
FIG. 5 is a graph showing the variation associated with tracking cells in accordance with an embodiment.

FIG. 5 is a graph showing the variation of $I_{CELL}$ among various integrated circuit chips associated with the tracking cells in accordance with an embodiment. Curve 502 shows the variation of $I_{CELL}$ associated with an individual tracking cell. The more tracking cells, the narrower the $I_{CELL}$ variation, as represented by curve 504. Therefore, in at least one embodiment, using multiple tracking cells means a tolerance margin with regard to the timing delay is reduced, and thus a smaller reading time τ is sufficient to cover the delay needed by possible weak bit cell reading.

As the number of dummy cells coupled to the tracking bit lines DBL and DBLB being configured as tracking cells for driving the tracking bit line DBL increases, the total driving capability of discharging the tracking bit line DBL increases. Therefore, the corresponding timing delay decreases. In some embodiments, the total capacitance driven by the tracking cells is increased in order to obtain a predetermined amount of time delay. For example, both bit lines DBL and DBLB are connected to provide a capacitance of ($C_{BL}+C_{BLB}$).

Figure 6:
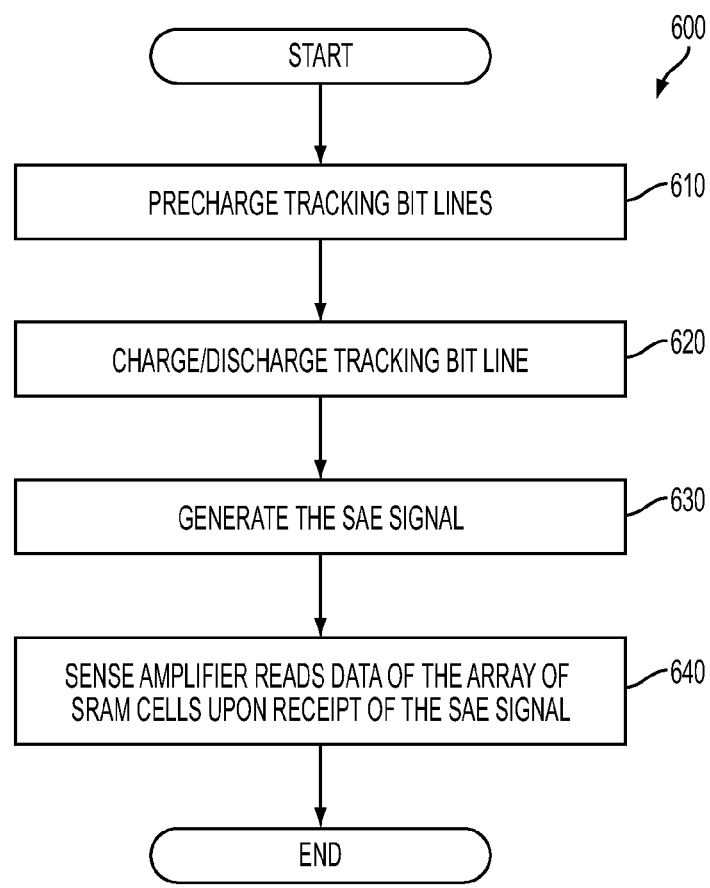
FIG. 6 is a flowchart of a method of generating timing signals for accessing storage cells in accordance with an embodiment.

FIG. 6 is a flowchart 600 of a method of generating timing signals for accessing storage cells in accordance with an embodiment. In order to ensure a proper read operation of the weak bit cell, a SRAM circuit is configured to have a proper read functionality a predetermined delay time after activation of a control signal. Operations 600 begin in block 610. The first and second tracking bit lines are precharged to a first voltage level, such as a supply voltage level VDD. In block 610, a tracking cell generates a tracking signal in response to a control signal. After the control signal is activated, the voltage of the first tracking bit line is discharged from the first voltage level to a second voltage level. In at least one embodiment, the tracking bit line is selectively charged or discharged by the tracking cell by coupling the first tracking bit line to an inverter circuit of the tracking cell. The tracking signal has a read timing τ, where the read timing τ is a function of a tracking capacitance C. The first and second tracking bit lines are arranged to have the tracking capacitance C sufficient to allow the read timing τ equal to or greater than the predetermined delay time needed for the read operation of a weak bit within the SRAM. In block 630, a control logic circuitry coupled to the tracking cell generates the SAE signal in response to the tracking signal.

In some embodiments, the SAE signal is activated (i.e., changing a voltage level from a logic low to a logic high) after the voltage of the first tracking bit line is equal to or lower than the second voltage level. The SAE signal is then supplied to a sense amplifier of the SRAM circuit. In block 640, the sense amplifier reads data of the array of SRAM cells upon receipt of the SAE signal. The SAE signal is generated and timed based on the tracking capacitance C. The capacitance C has a capacitance sufficient to allow a delay between the SAE signal and the control signal that would cover a timing needed for a proper read operation of the weak bit cell. In some embodiments, the SAE signal is activated a predetermined delay generated by logic delay circuitry after the voltage of the first tracking bit line is equal to or less than the second voltage level.

In at least some embodiments, a circuit is usable to generate a sense amplifier enable (SAE) signal for a static random access memory (SRAM) circuit. The circuit includes a first tracking bit line, a second tracking bit line, a tracking cell, and a control logic circuit. The second tracking bit line is electrically connected to the first tracking bit line. The tracking cell has a driving terminal and a non-driving terminal, where the non-driving terminal is connected to the second tracking bit line, and the driving terminal is connected to the first tracking bit line and configured to selectively charge or discharge a voltage on the first tracking bit line in response to a control signal. The control logic circuit is coupled to the first tracking bit line and configured to generate the SAE signal in response to the voltage level on the first tracking bit line.

At least one embodiment provides an SRAM circuit. The SRAM circuit includes at least a column of SRAM storage cells, read-write circuitry, and timing circuitry. The timing circuit includes a first tracking bit line, a second tracking bit line, a tracking cell, and a control logic circuit. The second tracking bit line is electrically connected to the first tracking bit line. The tracking cell has a driving terminal and a non-driving terminal, where the non-driving terminal is connected to the second tracking bit line, and the driving terminal is connected to the first tracking bit line and configured to selectively charge or discharge a voltage on the first tracking bit line in response to a control signal. The control logic circuit is coupled to the first tracking bit line and configured to generate the SAE signal in response to the voltage level on the first tracking bit line.

In some embodiments, for a static random access memory (SRAM) circuit is configured to have a proper read functionality a predetermined delay time after activation of a control signal, a method of generating a sense amplifier enable (SAE) signal in response to the control signal includes generating a tracking signal by a tracking cell in response to the control signal by selectively charging or discharging a voltage of a first tracking bit line coupled to a driving terminal of the tracking cell and a second tracking bit line coupled to a non-driving terminal of the tracking cell and electrically coupled to the first tracking bit line. The SAE signal is generated according to the tracking signal by control logic circuitry coupled to the tracking bit line. The tracking signal is activated a read timing after activation of the control signal, and the read timing is a function of a tracking capacitance charged or discharged by the tracking cell. The first tracking bit line and the second tracking bit line are arranged to have the tracking capacitance sufficient to allow the read timing equal to or greater than the predetermined delay time.

While the description is presented by way of examples and in terms of specific embodiments, it is to be understood that the invention is not limited to the disclosed embodiments. To the contrary, it is intended to cover various modifications and similar arrangements (as would be apparent to those skilled in the art). The above description discloses exemplary steps, but they are not necessarily required to be performed in the order described. Steps can be added, replaced, change in order, and/or eliminated as appropriate, in accordance with the spirit and scope of the description. Embodiments that combine different claims and/or different embodiments are within the scope of the description and will be apparent to those skilled in the art after reviewing this disclosure. Therefore, the scope of the appended claims should be accorded the broadest interpretation so as to encompass all such modifications and similar arrangements.

The invention claimed is:

1. A circuit to generate a sense amplifier enable (SAE) signal for a static random access memory (SRAM) circuit, the circuit comprising:
   a first tracking bit line;
   a second tracking bit line electrically connected to the first tracking bit line;
   a tracking cell having a driving terminal and a non-driving terminal, the non-driving terminal being connected to the second tracking bit line, and the driving terminal being connected to the first tracking bit line and configured to selectively charge or discharge a voltage on the first tracking bit line in response to a control signal; and
   a control logic circuit coupled to the first tracking bit line and configured to generate the SAE signal in response to the voltage level on the first tracking bit line.

2. The circuit of claim 1, wherein the control logic circuit is configured to activate the SAE signal at a time delay after the control signal is activated, and the time delay is proportional to a capacitance value of the first tracking bit line and the second tracking bit line.

3. The circuit of claim 2, wherein the time delay is set to allow the sense amplifier to distinguish a voltage difference between a pair of bit lines coupled to a SRAM storage cell of the SRAM circuit after the control signal is activated.

4. The circuit of claim 1, wherein the second tracking bit line comprises at least two segments, and at least one of the segments is not electrically coupled to the first tracking bit line.

5. The circuit of claim 1, wherein the tracking cell, the first tracking bit line, and the second tracking bit line are a SRAM storage cell and a pair of bit lines coupled to the SRAM storage cell of the SRAM circuit.

6. The circuit of claim 1, further comprising another tracking cell having a driving terminal coupled to the first tracking bit line.

7. The circuit of claim 1, wherein the control logic circuit further comprises logic delay circuitry configured to delay the generation of the SAE signal in response to the voltage of the first tracking bit line for a predetermined delay period.

8. A static random access memory (SRAM) circuit comprising:
at least one column of SRAM storage cells;
read/write circuitry coupled to the column of SRAM storage cells to access the column of SRAM storage cells, the read/write circuitry comprising a sense amplifier configured to read data of the column of SRAM storage cells upon receipt of a sense amplifier enable (SAE) signal; and
timing circuitry configured to generate the SAE signal in response to a control signal, the timing circuitry comprising:
a first tracking bit line;
a second tracking bit line electrically connected to the first tracking bit line;
a tracking cell having a driving terminal and a non-driving terminal, the non-driving terminal being connected to the second tracking bit line, and the driving terminal being connected to the first tracking bit line and configured to selectively charge or discharge a voltage on the first tracking bit line in response to the control signal; and
a control logic circuit coupled to the first tracking bit line and configured to generate the SAE signal in response to the voltage level on the first tracking bit line.

9. The SRAM circuit of claim 8, wherein the control logic circuit is configured to activate the SAE signal at a time delay after the control signal is activated, and the time delay is proportional to a capacitance value of the first tracking bit line and the second tracking bit line.

10. The SRAM circuit of claim 9, wherein the time delay is set to allow the sense amplifier to distinguish a voltage difference between a pair of bit lines coupled to a SRAM storage cell of the column of SRAM storage cells after the control signal is activated.

11. The SRAM circuit of claim 8, wherein the second tracking bit line comprises at least two segments, and at least one of the segments is not electrically coupled to the first tracking bit line.

12. The SRAM circuit of claim 8, wherein the tracking cell, the first tracking bit line, and the second tracking bit line are a SRAM storage cell of the column of SRAM storage cells and a pair of bit lines coupled to the column of SRAM storage cells.

13. The SRAM circuit of claim 8, further comprising another tracking cell having a driving terminal coupled to the first tracking bit line.

14. The SRAM circuit of claim 8, wherein the control logic circuit further comprises logic delay circuitry configured to delay the generation of the SAE signal in response to the voltage of the first tracking bit line for a predetermined delay period.

15. A method of generating a sense amplifier enable (SAE) signal for a static random access memory (SRAM) circuit in response to a control signal, the SRAM circuit being configured to have a proper read functionality a predetermined delay time after activation of the control signal, the method comprising:
generating a tracking signal by a tracking cell in response to the control signal by selectively charging or discharging a voltage of a first tracking bit line coupled to a driving terminal of the tracking cell and a second tracking bit line coupled to a non-driving terminal of the tracking cell and electrically coupled to the first tracking bit line; and
generating the SAE signal according to the tracking signal, the SAE signal generated by control logic circuitry coupled to the tracking bit line,
the tracking signal being activated a read timing after activation of the control signal, the read timing being a function of a tracking capacitance charged or discharged by the tracking cell, the first tracking bit line and the second tracking bit line being arranged to have the tracking capacitance sufficient to allow the read timing equal to or greater than the predetermined delay time.

16. The method of claim 15, the generation of the tracking signal is performed by operating two or more tracking cells coupled to the first tracking bit line.

17. The method of claim 15, further comprising:
precharging the first and second tracking bit lines to a first voltage level;
discharging the voltage of the first tracking bit line from the first voltage level to a second voltage level after the activation of the control signal; and
activating the SAE signal after the voltage of the first tracking bit line is equal to or less than the second voltage level.

18. The method of claim 17, wherein the activation of the SAE signal is performed by changing the SAE signal from a logic low voltage level to a logic high voltage level.

19. The method of claim 17, wherein the discharging of the voltage of the first tracking bit line comprises coupling the first tracking bit line to an inverter circuit of the tracking cell.

20. The method of claim 17, further comprising:
activating the SAE signal a predetermined delay time after the voltage of the first tracking bit line is equal to or less than the second voltage level, the predetermined delay time generated by logic delay circuitry.

* * * * *